(12) United States Patent
Liu

(10) Patent No.: US 6,826,054 B2
(45) Date of Patent: Nov. 30, 2004

(54) HEAT SINK CLIP ASSEMBLY

(75) Inventor: HouBen Liu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/364,895

(22) Filed: Feb. 11, 2003

(65) Prior Publication Data
US 2004/0047130 A1 Mar. 11, 2004

(30) Foreign Application Priority Data
Sep. 9, 2002 (TW) .................................... 91214018 U

(51) Int. Cl.[7] .............................................. H05K 7/20
(52) U.S. Cl. ........................ 361/719; 361/704; 257/719
(58) Field of Search ................. 361/689, 752, 361/758–761, 772–774, 796, 801, 804, 807–810, 825, 829, 831, 704–719; 257/710–733; 439/76.1

(56) References Cited
U.S. PATENT DOCUMENTS 5,901,039 A * 5/1999 Dehaine et al. ............. 361/704
6,449,162 B1 * 9/2002 Corbin et al. ............... 361/719
6,545,879 B1 * 4/2003 Goodwin .................... 361/807
6,549,410 B1 * 4/2003 Cohen ........................ 361/704

* cited by examiner

Primary Examiner—Darren Schuberg
Assistant Examiner—Anthony Q. Edwards
(74) Attorney, Agent, or Firm—Wei Te Chung

(57) ABSTRACT

A heat sink clip assembly is for attaching a heat sink (30) to a central processing unit (CPU) (41) mounted on a mother board (40), and includes a back plate (10), four posts (13) and four fasteners (20). Each fastener includes a bottom engaging end (27), a neck (25) received in a corresponding through hole (35) of the heat sink, a top cap (21) engaged on the neck, and a spring (23) disposed around the neck and seated on the heat sink. Each post includes a top threaded end (17), and an annular groove (15) receiving a plastic ring (50) therein. The posts extend upwardly from the back plate, and are engaged in the mother board. The engaging end of each fastener defines an internal threaded hole adjustably engaging with the threaded end of a corresponding post, thereby attaching the heat sink to the CPU with even clamping forces.

16 Claims, 3 Drawing Sheets

HEAT SINK CLIP ASSEMBLY

BACKGROUND OF THE INVENTION

1. Field of the Invention

The present invention relates to means for securing heat sinks in apparatus such as computers, and particularly to a clip assembly for attaching a heat sink to a computer electronic package.

2. Related Art

Developments in integrated circuits have resulted in greater circuit density and complexity, thus increasing heat generated by operation of such integrated circuits within an electronic package. Heat sinks are often attached onto the electronic packages to efficiently remove the heat.

Nowadays, a resilient clip is popularly used to attach a heat sink onto an electronic package such as a central processing unit (CPU). The clip engages with a socket of the CPU. However, the CPU bears an entire weight of the heat sink. If a large, heavy heat sink is employed, it is difficult for the assembly to pass a standard vibration test. Furthermore, when a large heat sink is attached to the CPU, it is difficult to ensure that the retaining forces applied by the clip are uniform. If the retaining forces are not uniform, the heat sink is unlikely to have uniform thermal contact with the corresponding surface of the CPU. In such case, the efficiency of heat dissipation is reduced.

Another means for attaching a heat sink on a CPU comprises four through holes defined in four corners of the heat sink, and four threaded holes defined in a mother board. Screws are extended through the through holes of the heat sink and engaged in the threaded holes of the mother board, thereby attaching the heat sink to the CPU. However, the heat sink is rigidly connected to the CPU. It is difficult to ensure that the heat sink applies uniform pressure on the CPU, thus tending to reduce the efficiency of heat dissipation. Furthermore, the rigid connection is prone to deform the mother board.

Therefore, an improved means for securing a heat sink which overcomes the above-mentioned problems is desired.

BRIEF SUMMARY OF THE INVENTION

Accordingly, an object of the present invention is to provide a heat sink clip assembly for readily attaching a heat sink to an electronic package such as a CPU, and for readily detaching the heat sink therefrom.

Another object of the present invention is to provide a heat sink clip assembly which ensures that a heat sink applies substantially uniform pressure on an electronic package such as a CPU.

To achieve the above-mentioned objects, a heat sink clip assembly in accordance with a preferred embodiment of the present invention attaches a heat sink to a CPU that is mounted on a mother board. The clip assembly comprises a back plate, four posts, and four fasteners. Each fastener comprises a bottom engaging end, a narrowed neck, a top cap engagable on the neck, and a coil spring. The neck of each fastener is extended upwardly through a hole of the heat sink such that the engaging end abuts a base of the heat sink. The top cap is engaged on the neck, and the spring is disposed around the neck and seated on the heat sink. The fasteners are thus pre-assembled to the heat sink. Each post comprises a threaded end at a top thereof, and an annular groove defined in a middle portion thereof. The groove receives a plastic ring therein. The posts extend upwardly from the back plate, and are pressed upwardly through apertures of the mother board. The mother board is thus pre-assembled on the back plate. The engaging end of each fastener defines an internal threaded hole engaging with the threaded end of a corresponding post, thereby attaching the heat sink to the CPU. Engagement of each fastener with its corresponding post can be adjusted, so that the four springs cooperatively apply even clamping forces to the heat sink.

Other objects, advantages and novel features of the present invention will be drawn from the following detailed description of the preferred embodiment of the present invention with the attached drawings, in which:

DESCRIPTION OF THE PREFERRED EMBODIMENT

Figure 1:
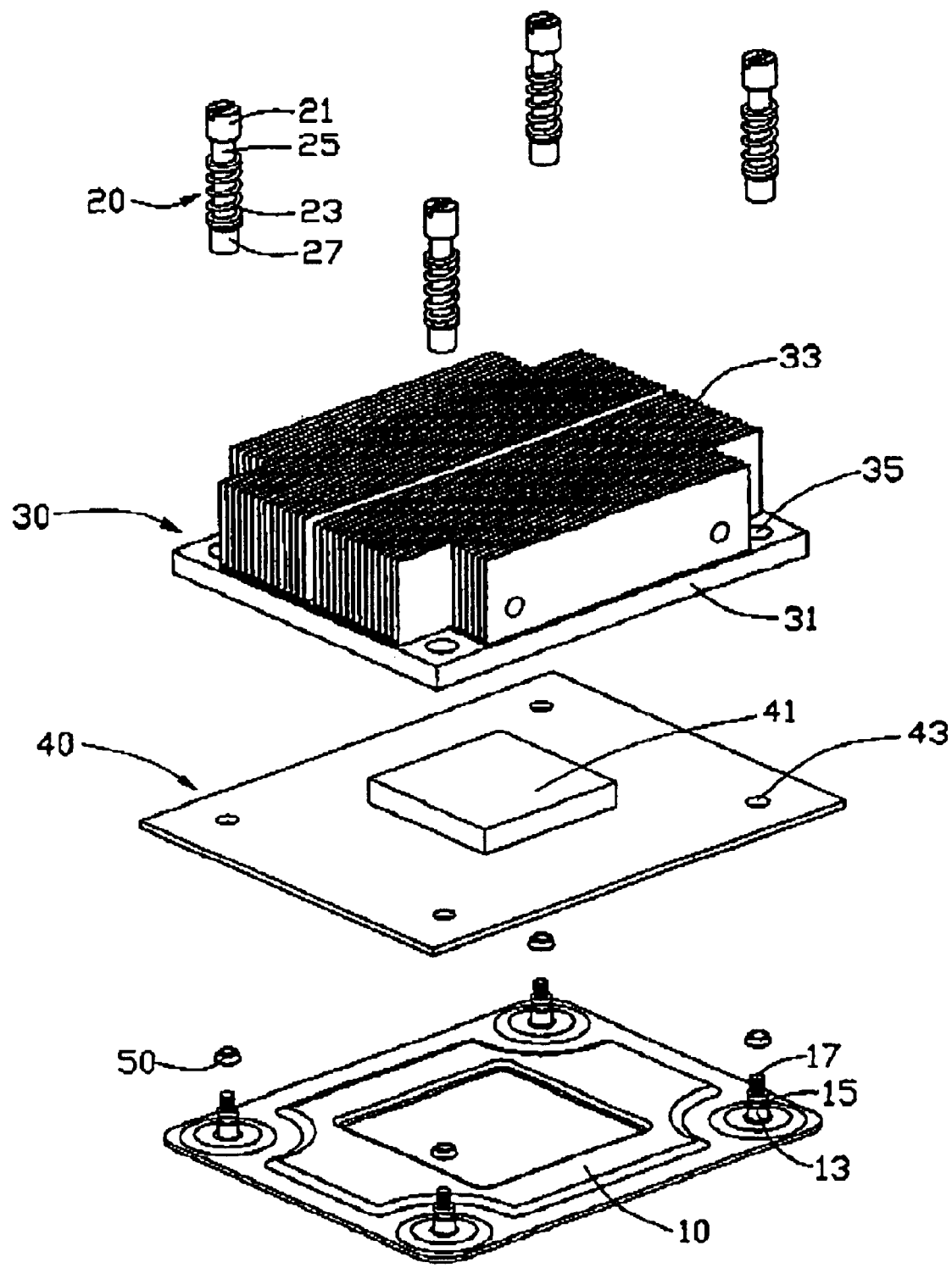
FIG. 1 is an exploded isometric view of a heat sink clip assembly in accordance with the preferred embodiment of the present invention, together with a heat sink, and a CPU mounted on a mother board.

Referring to FIG. 1, a heat sink clip assembly in accordance with the present invention is used to attach a heat sink 30 to a CPU 41 that is mounted on a mother board 40.

The mother board 40 defines four through apertures 43 at four corners thereof. The heat sink 30 comprises a base 31, and a plurality of parallel fins 33 extending upwardly from the base 31. Four through holes 35 are defined in four corners of the base 32, corresponding to the through apertures 43 of the mother board 40.

The heat sink clip assembly comprises a back plate 10, four posts 13, and four fasteners 20. The back plate 10 is formed with an electrically insulative film on a face thereof that contacts the mother board 40. The posts 13 extend upwardly from four corners of the back plate 10. Each post 13 comprises an annular groove 15 defined in a middle portion thereof, and a threaded end 17 at a top thereof. Four plastic rings 50 are for respective engagement in the annular grooves 15 of the posts 13. Each plastic ring 50 is tapered, and has a break (not labeled) to provide resilient deformation.

Figure 2:
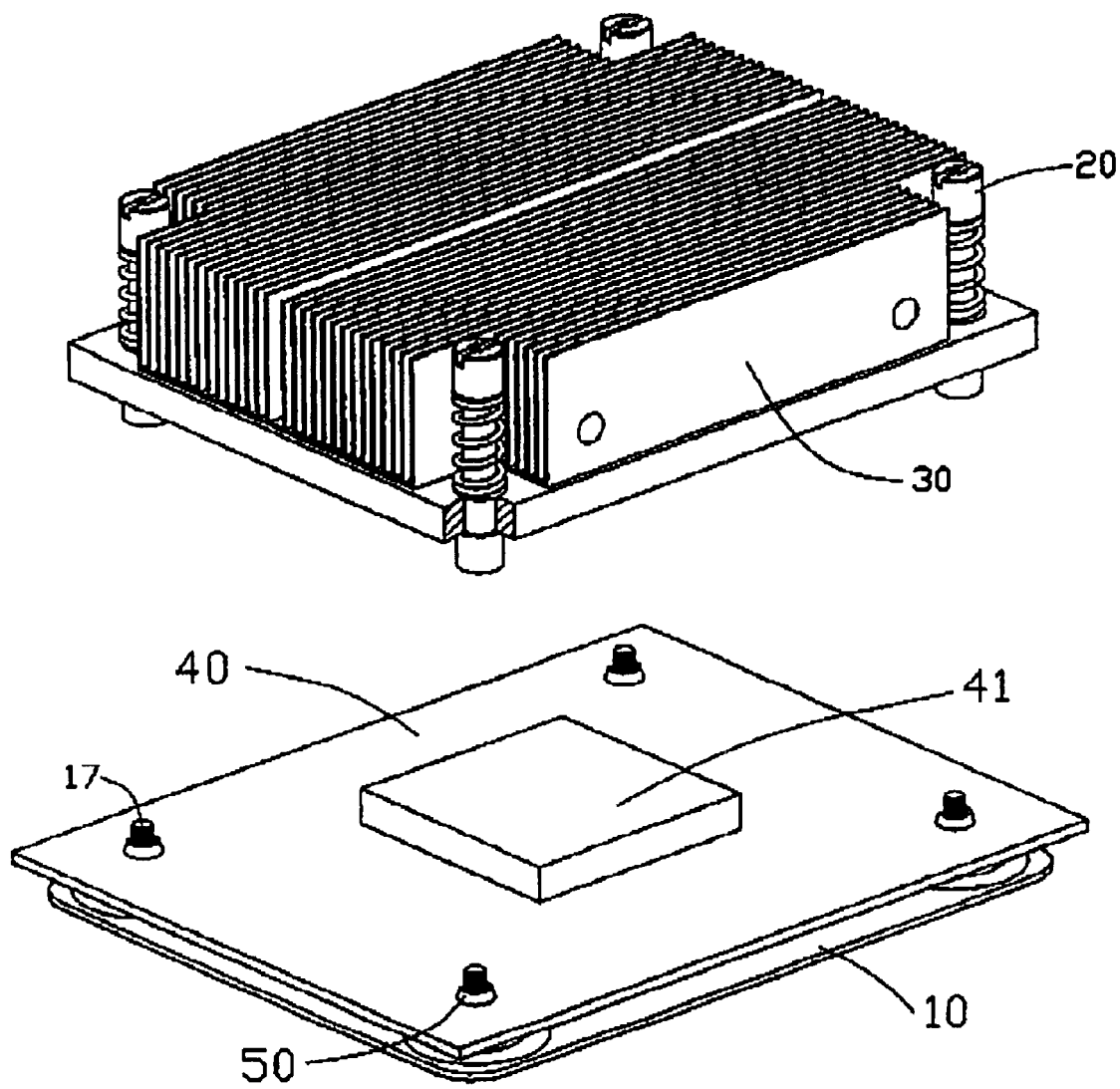
FIG. 2 is a partly assembled view of FIG. 1.

Each fastener 20 is generally cylindrical, and comprises a bottom engaging end 27, a narrowed neck 25, a top cap 21 engagable on the neck 25, and a coil spring 23 disposed around the neck 25. An internal threaded hole (not visible) is defined in the engaging end 27. A diameter of the engaging end 27 and a diameter of the cap 21 are each greater than a diameter of each through hole 35 of the heat sink 30. Referring to FIG. 2, in the preferred embodiment, the narrowed neck 25 of the fastener 20 is extended upwardly through a corresponding through hole 35 of the heat sink 30. The engaging end 27 abuts a bottom of the base 31 of the heat sink 30. The spring 23 is placed around the neck 25. The cap 21 is interferentially engaged with a top end of the neck 25, such that the spring 23 is retained around the neck 25 and seated on a top of the base 31 of the heat sink 30. The four fasteners 20 are thus pro-assembled to the heat sink 30.

Referring also to FIG. 2, in further pre-assembly, the plastic rings 50 are received in the annular grooves 15 of the posts 13 of the back plate 10. The mother board 40 is placed on the back plate 10, and the posts 13 are pressed through the through apertures 43 of the mother board 40. The plastic rings 50 are thereby elastically compressed so that they pass through the through apertures 43, and then decompress once they have reached a top side of the mother board 40. The back plate 10 is thus pre-assembled to the mother board 40. The plastic rings 50 deformably and firmly retain the mother board 40 on the back plate 10. Alternatively, the plastic rings 50 can be received in the annular grooves 15 of the posts 13 after the annular grooves 15 are exposed above the top side of the mother board 40.

Figure 3:
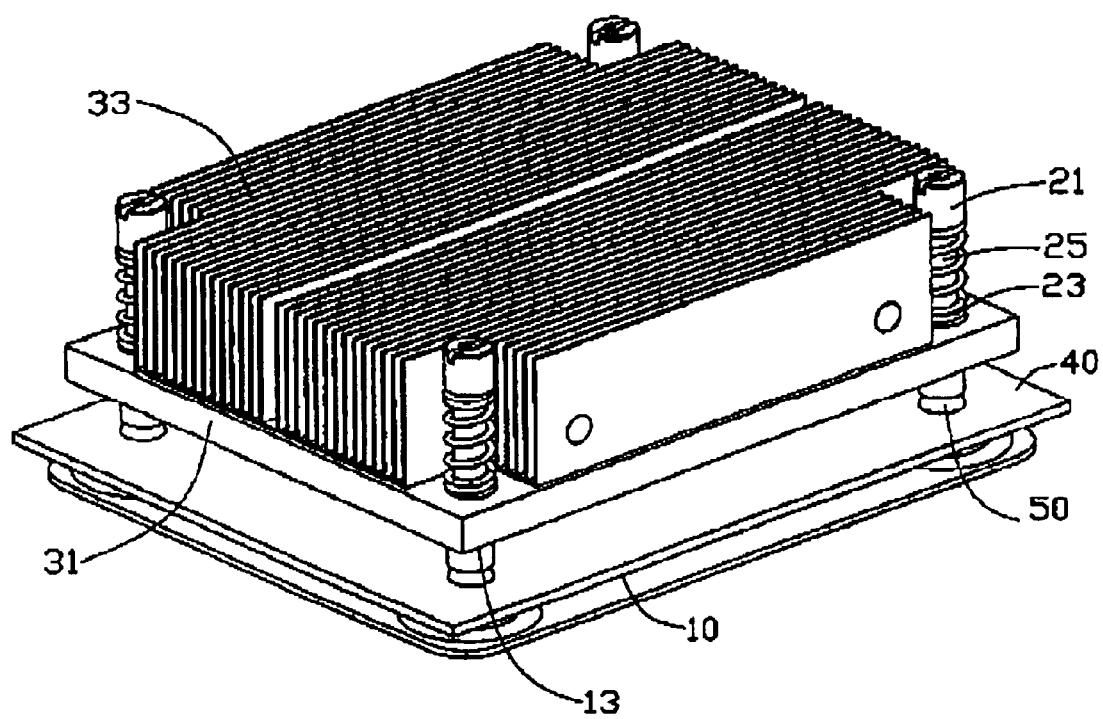
FIG. 3 is an assembled view of FIG. 1.

Referring to FIG. 3, the heat sink 30 is placed on the CPU 41 that is on the mother board 40. Each fastener 20 is depressed and rotated, so that the threaded end 17 of a corresponding post 13 engages in the internal threaded hole of the engaging end 27 of the fastener 20. The spring 23 of the fastener 20 is compressed between the base 31 of the heat sink 30 and the cap 21 of the fastener 20. Engagement of each fastener 20 with its corresponding post 13 can be adjusted, so that the four springs 23 cooperatively apply even clamping forces to the heat sink 30.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A clip and unit assembly, comprising:
   a first unit defining a plurality of spaced through apertures therein;
   a second unit attached to a top face of the first unit, the second unit defining a plurality of through holes in alignment with the through apertures of the first unit;
   a plurality of posts extending through the through apertures of the first unit, each of the posts having a top threaded end;
   a plurality of fasteners extending through the through holes of the second unit, each of the fasteners having a bottom engaging end, a narrowed neck, a top cap engaged on the neck, and a spring disposed around the neck and seated on the second unit at a corresponding through hole, the engaging end defining a threaded hole for engagement with the threaded end of a corresponding post, whereby the spring is compressed between the second unit and the cap, and the second unit can thus evenly press on the first unit; and
   a back plate attached to an underside of the first unit, wherein the posts extend unwardly from the back plate, each of the posts defines an annular groove under the threaded end, a deformable ring is received in the groove, and the ring is deformably seated on a top face of the first unit to firmly retain the first unit on the back plate.

2. The clip and unit assembly as described in claim 1, further comprising an electronic unit mounted to the first unit between the through apertures.

3. The clip and unit assembly as described in claim 1, wherein the first unit is a circuit substrate, and the second unit is a heat sink.

4. The clip and unit assembly as described in claim 1, wherein the ring is tapered, and has a break to provide elastic deformation.

5. The clip and unit assembly as described in claim 1, wherein a diameter of each of the through holes of the second unit is greater than a diameter of the neck of each of the fasteners, the diameter of each of the through holes is less than a diameter of the engaging end of each of the fasteners, and an internal diameter of each of the springs is greater than a diameter of each of the through holes.

6. The clip and unit assembly as described in claim 5, wherein the neck of each of the fasteners is extended upwardly through the corresponding through hole, and the cap is interferentially engaged on the neck that the spring is retained on the second unit.

7. A clip and unit assembly comprising:
   first and second units adapted to be firmly attached to each other,
   said first unit defining a plurality of through apertures in a vertical direction,
   said second unit defining a plurality of through holes in a vertical direction;
   a plurality of posts extending through the through apertures, respectively, each of the posts being adapted to engage at an underside of the first unit, and having a threaded upper end; and
   a plurality of fasteners movably retained in the through holes, respectively, each of the fasteners including a bottom engaging end disposed under the second unit and defining a threaded hole engaging with the threaded end of a corresponding post, a surrounding spring seated on a top face of the second unit, and a top cap engaged with an upper end of each of the fastener to retain said spring on the second unit, wherein
   the engaging end of each of the fasteners abuts a bottom of the second unit, and the cap is engaged with the upper end of the fasteners, the fasteners thereby being pre-assembled to second unit.

8. The clip and unit assembly as described in claim 7, wherein each of the posts defines an annular groove under the threaded end, an elastically deformable ring is received in the groove, and the ring is seated on a top face of the first unit, the posts thereby being pre-assembled to the first unit.

9. An assembly including:
   a printed circuit board with thereon an electronic package assembly and therein a plurality of through apertures surrounding said electronic package assembly;
   a heat sink seated upon the printed circuit board and defining a plurality of through holes in alignment with said through apertures, respectively;
   a back plate located on an underside of the printed circuit board opposite to said heat sink;
   a plurality of posts upwardly extending from the back plate and through both the corresponding through apertures and through holes, respectively;
   a plurality of fasteners fastened to top portions of the corresponding posts, respectively, to form pairs of fastener/post assembles;
   a plurality of caps formed on top portions of the corresponding fasteners, respectively;
   a plurality of spring devices respectively abutting against said caps and downwardly urging the heat sink around the corresponding fasteners, respectively; and
   each of said fastener/post assembles including a fastening ring downwardly pressing against the printed circuit board toward the back plate.

10. The assembly as described in claim 9, wherein said fastening ring is attached to one of the corresponding fastener and post.

11. The assembly as described in claim 9, wherein said fastening ring is attached to the post of the corresponding pair.

12. The assembly as described in claim 9, wherein said fastening ring is used to pre-assembled the back plate and the printed circuit board before the heat sink is assembled thereto.

13. The assembly as described in claim 9, wherein said fastening ring is inwardly compressible so as to permissibly extend through the corresponding through hole of the printed circuit board during pre-assembling of the printed circuit board and the back plate.

14. The assembly as described in claim 9, wherein the fastener and the corresponding post of each pair are screwed to each other.

15. The assembly as described in claim 9, wherein said fastener encloses the corresponding post.

16. The assembly as described in claim 9, wherein said spring device surrounds the corresponding fastener.

\* \* \* \* \*